United States Patent [19]
Bittner et al.

[11] Patent Number: 5,480,488
[45] Date of Patent: Jan. 2, 1996

[54] APPARATUS FOR SUPPLYING CVD COATING DEVICES

[75] Inventors: Hans J. Bittner, Ingelheim; Hans-Jürgen Klein; Thomas Küpper, both of Bad Gandersheim; Ewald Mörsen, Mörfelden, all of Germany

[73] Assignee: Schott Glaswerke, Mainz, Germany

[21] Appl. No.: 141,363

[22] Filed: Oct. 28, 1993

[30] Foreign Application Priority Data

Oct. 28, 1992 [DE] Germany .......................... 42 36 324.1

[51] Int. Cl.⁶ ............................ B05C 11/02; B05C 11/10; C23C 16/52
[52] U.S. Cl. .................. 118/667; 118/666; 118/688; 118/692; 118/710; 118/715; 118/724; 118/726
[58] Field of Search .................. 118/666, 667, 118/688, 692, 710, 715, 720, 724, 722, 726; 137/266, 264; 392/400, 401

[56] References Cited

U.S. PATENT DOCUMENTS

| | | | |
|---|---|---|---|
| 4,314,837 | 2/1982 | Blankenship | 65/3.12 |
| 4,488,506 | 12/1984 | Heinecke et al. | 118/726 |
| 4,545,801 | 10/1985 | Miyajiri et al. | 118/726 |
| 5,069,930 | 12/1991 | Hussla et al. | 118/715 |
| 5,186,120 | 2/1993 | Ohnishi et al. | 118/715 |
| 5,252,134 | 10/1993 | Stauffer | 118/715 |

FOREIGN PATENT DOCUMENTS 0018068  10/1980  European Pat. Off. .
2-250977 12/1990  Japan .

OTHER PUBLICATIONS

*Patent Abstracts of Japan* (C–791), vol. 14, No. 578, Dec. 21, 1990 (abstract of JP–A–2–250977).

*Primary Examiner*—R. Bruce Breneman
*Assistant Examiner*—Rodney G. McDonald
*Attorney, Agent, or Firm*—Millen, White, Zelano, & Branigan

[57] ABSTRACT

An apparatus supplies CVD coating devices with coating gas and includes an intermediate reservoir for accommodation of the gaseous coating material arranged between a storage tank and a coating device. The volume of the reservoir is set to a predetermined, maximum pressure change in the intermediate reservoir upon withdrawal of the mass of gas required for a coating step. The intermediate reservoir can be connected to a gas recovery station.

19 Claims, 5 Drawing Sheets

APPARATUS FOR SUPPLYING CVD COATING DEVICES

1. Field of the Invention

The invention relates to an apparatus for supplying at least one CVD coating device with coating gas, with at least one storage tank for the coating material and a pipeline system between the storage tank and the coating device wherein mass flow regulators and/or valves are arranged in the pipeline system.

2. Background Art

For the simultaneous coating of several substrates by means of a CVD process, it is known to provide several coating stations supplied with the gaseous coating materials suitable for the coating process. A source of gas common to all coating stations is provided for each gas mixture.

Cold-light reflectors can be produced, for example, by applying an alternating succession of two layers having differing compositions (20–40 layers in total) and differing layer thicknesses. A rapid change from one gas mixture to the other is to be possible herein as a prerequisite so that the total time period for a complete coating of the substrates can be kept to a minimum for economical reasons. Besides, an economical usage is intended due to the high costs of the layer-forming gases, i.e. the gases should be converted into layer material as completely as possible without a portion thereof flowing away unused or having to be passed on to waste disposal.

JP-A-02-290977 discloses a gas generator which is not based on the principle of direct vaporization but rather on the carrier gas principle. Different carrier gases are fed through two feed conduits to two sublimation baths wherein additional materials are provided. After sublimation has taken place, the gases pass into a mixing chamber and from there to the reaction chamber where the coating step is performed. An exact temperature control is executed in this process.

EP 0 018 068 describes a facility for the regulated feeding of vapors of liquids with low vapor pressure to a facility for the production of preforms for lightguides in accordance with a CVD method. The time for producing a preform ranges on the order of hours so that changes in the gas composition need take place only gradually. For this reason, setting times of the mass flow regulators are of no importance for the duration of the coating step. Since the reaction gas flows only when it is used for coating, the problem of an economical usage of these gases does not exist. In order to exchange the storage tanks, the connecting conduit to the coating device must be interrupted so that the respective on-stream time of the facility is restricted by the capacity of the storage tanks.

SUMMARY OF THE INVENTION

It is an object of the present invention to provide an apparatus for the uniform supply of CVD coating devices with coating gases permitting a rapid changing of the coating gases with economical usage without gas losses and ensuring a continuous supply without interruption.

Upon further study of the specification and appended claims, further objects and advantages of this invention will become apparent to those skilled in the art.

The apparatus contains a large-volume intermediate reservoir between the storage tank and the coating device or devices. In this case, there occur at most only small pressure differences in the feed lines to the individual coating devices which are rapidly compensated for. Another advantage resides in that the gas in the intermediate reservoir is immediately available and thus is independent of the gas source or sources of the storage tank and its or their conditions. Even if the gas supply from the storage tank to the intermediate reservoir were to be interrupted or defective, the coating device can enjoy continued gas supply for a certain period of time without having to stop the coating procedure. Particularly in case at least two storage tanks are provided, a continuous operation is ensured because the exchange of the respectively empty storage tank can take place without time pressure inasmuch as the other (filled) storage tank maintains the supply to the intermediate reservoir.

The volume of the intermediate reservoir is preferably chosen to be of such a size that, during gas withdrawal, only a predetermined maximum pressure change will occur in the intermediate reservoir. Preferably, the volume $V_z$ of the intermediate reservoir is in a range from 0.1 V to 10 V wherein $V=M/(p_z \times (\Delta p/p)_z^o)$. M means the total mass flow of the coating gas in mbar×l/s, and $(\Delta p/p)_z^o$ is the given relative pressure change per second in the intermediate reservoir. $p_z$ designates the pressure in the intermediate reservoir in mbar, wherein $p_z$ is larger than the process pressure in the coating device.

An example is to explain the requirement to be met by the volume of the intermediate reservoir. A pulsed plasma CVD process was utilized for coating cap-shaped objects with a $TiO_2$ layer. The coating parameters were as follows:

Cycle period: 15 msec

Cap volume: 50 ml

Process pressure: 1 mbar $TiCl_4$ pressure in intermediate reservoir: 50 mbar

Temperature in intermediate reservoir: 50° C.

Composition of coating gas: 2% $TiCl_4$ and 98% $O_2$

Number of cap-shaped objects to be coated at the same time: 52

In this example, the needed mass flow of $TiCl_4$ ranges at M=3.5 mbar×l/sec. This corresponds, at 50 mbar, to a volume stream of 70 ml/sec. If the pressure in the intermediate reservoir is to be reduced by at most 0.5% by the removal of this gas volume (corresponds to $(\Delta p/p)_z^o=0.005/s$), then the intermediate reservoir is to have a volume of 14 l. Since the gas flow is laminar under the present conditions, the mass flow passing through the pipelines is dependent as a square on the preliminary pressure. Accordingly, the mass flow varies at most by 1%/sec.

In order to be able to replenish with maximum speed the withdrawn gas by drawing gas from the storage tank, regulating valves and/or mass flow regulators arranged between the storage tank and the intermediate reservoir should exhibit a setting time of less than 1 second.

The intermediate reservoir has a manometer and a temperature sensor, the latter beingsconnected to a regulating device. A temperature control unit connected to the first regulating device maintains the temperature at a predetermined constant value. The temperature preferably ranges between 30° and 200° C. The manometer is connected to a further regulating device maintaining the pressure of the gas contained in the intermediate reservoir at between 20 and 1,000 mbar. The intermediate reservoir can contain the layer-forming material in the gaseous condition or also in the liquid and gaseous states in a thermal equilibrium.

The intermediate reservoir is connected with at least one storage tank wherein the layer-forming gas is generated. In the production of cold-light reflectors, for example, layers of $TiO_2$ and $SiO_2$ are applied alternatingly by means of a plasma CVD method. For this purpose, mixtures can be employed of oxygen and the layer-forming agent hexamethyldisiloxane (HMDSO), on the one hand, and oxygen and the layer-forming material titanium tetrachloride ($TiCl_4$), on the other hand, as coating gases. HMDSO and $TiCl_4$ are liquid at room temperature and exhibit a vapor pressure of about 43 and 13 mbar, respectively.

Separate storage tanks and intermediate reservoirs are provided for each layer-forming material.

Preferably, two identical storage tanks are connected to one intermediate reservoir. From the first storage tank, heated gas, if needed, is fed to the intermediate reservoir while the replenishing step, the degasification of the liquids, and the heating-up step take place in the second tank. The temperature of the liquid is set, for example by heating the storage tanks, to such a value that the vapor pressure of the liquids is adequately high as a preliminary pressure for commercially available mass flow regulators arranged between the storage tank and the intermediate reservoir. A pressure of 50 to 100 mbar can be considered adequate. This corresponds, for $TiCl_4$ and HMDSO, to a temperature of 50°–60° and, respectively, 30°–45° C.

The storage tanks preferably include temperature sensors for thermostating and furthermore filling level sensors connected to a regulating device. The latter switches the valves of the storage tanks so that constant gas generation is ensured. Once the filling level has dropped below a threshold value, switching over to the filled reserve storage tank, ready for operation, takes place via a valve system—practically without interruption as regards the vapor stream.

Filling of the tanks can take place either at the site, or storage tanks that were filled at some other location can be connected. By means of a suitable gas purging, the contamination of critical surfaces is precluded herein.

In accordance with another embodiment, the manometer is electrically connected by way of a regulating device with a regulating valve or mass flow regulator arranged in the pipeline between the storage tank and the intermediate reservoir. In this way, a system is created for maintaining the pressure in the intermediate reservoir at a constant value. In case layer-forming gas is withdrawn from the intermediate reservoir, the pressure will drop below the given threshold value. Then, by way of the regulating valve or the mass flow regulator, layer-forming gas is replenished from the storage tank until the required pressure in the intermediate reservoir has been reached. This embodiment offers the advantage that no layer-forming gas needs to be discarded during the coating pauses.

If the intermediate reservoir, according to another embodiment, contains the liquid layer-forming material and the corresponding gas in a thermal equilibrium wherein the temperature is regulated to a desired value, the intermediate reservoir will include a filling level meter electrically connected by way of a regulating device to a valve or mass flow regulator arranged in the pipeline between the storage tank and the intermediate reservoir. The level meter has limit value pickups so that the filling level can be controlled between two levels. In case the level drops below a predetermined limit value, coating material in the liquid form is refilled from the storage tank via the valve or the mass flow regulator. In such a case, a pressure regulation as in the aforedescribed embodiment is unnecessary.

For reasons of process stability, it may be necessary for the gases to flow out of the respective storage tanks even if they are not at all needed for the coating step, such as, for example, during the coating pauses. In order to be able to recover the layer-forming materials which, in most cases, are expensive, the intermediate reservoir is connected to a gas recovery station. Preferably, a valve is arranged in the pipeline between the gas recovery station and the intermediate reservoir; this valve is electrically connected to the manometer of the intermediate reservoir via a regulating device. The gas constantly being replenished from the storage tank or tanks would lead, in the coating pauses, to an undesirable pressure rise in the intermediate reservoir. This pressure rise is recorded by the manometer which latter opens, via the regulating device, the valve between the gas recovery station and the intermediate reservoir so that, during the coating pauses, the excess gas can flow into the gas recovery station.

The recovery vessel of the gas recovery station is at a temperature lower than that of the intermediate reservoir and is maintained at such temperature so that the excess material is condensed therein, and the recovery vessel acts as a cryopump and accordingly no additional pump is required for removal by pumping. The condensed liquid is of high purity and can be reused for coating.

According to another embodiment, the pipeline arranged between the storage tank and the intermediate reservoir is connected by way of a valve to the gas recovery station. In this example, the manometer of the intermediate reservoir and the valve in the pipeline leading to the gas recovery station are connected to the regulating device. The gas likewise flows without interruption from the storage tank and leads, in the coating pauses, to a pressure rise in the intermediate reservoir; this pressure rise is detected by the manometer. In this case, by way of the regulating device, the valve in the pipeline leading to the gas recovery station is opened so that the excess gas can flow without detour via the intermediate reservoir into the gas recovery station.

In addition to the above-described embodiments, the manometer and the temperature sensor can be electrically connected with a control device connected to the coating device and controlling the coating time or the mass flow of the coating gases. This offers the advantage that the actual pressure, possibly deviating from the required value, of the layer-forming gas in the intermediate reservoir can be taken as a parameter for the coating period or the mass flow of the coating gases so that even minimal changes of the pressure can be taken into account by way of a corresponding regulation of coating time or mass flow. In this way, the desired layer thickness will always be applied to the substrates to be coated.

BRIEF DESCRIPTION OF THE DRAWINGS

Various other objects, features and attendant advantages of the present invention will be more fully appreciated as the same becomes better understood when considered in conjunction with the accompanying drawings, in which like reference characters designate the same or similar parts throughout the several views, and wherein.

The figures do not illustrate means for the degasification of the liquids in the storage tanks.

DETAILED DESCRIPTION

Figure 1:
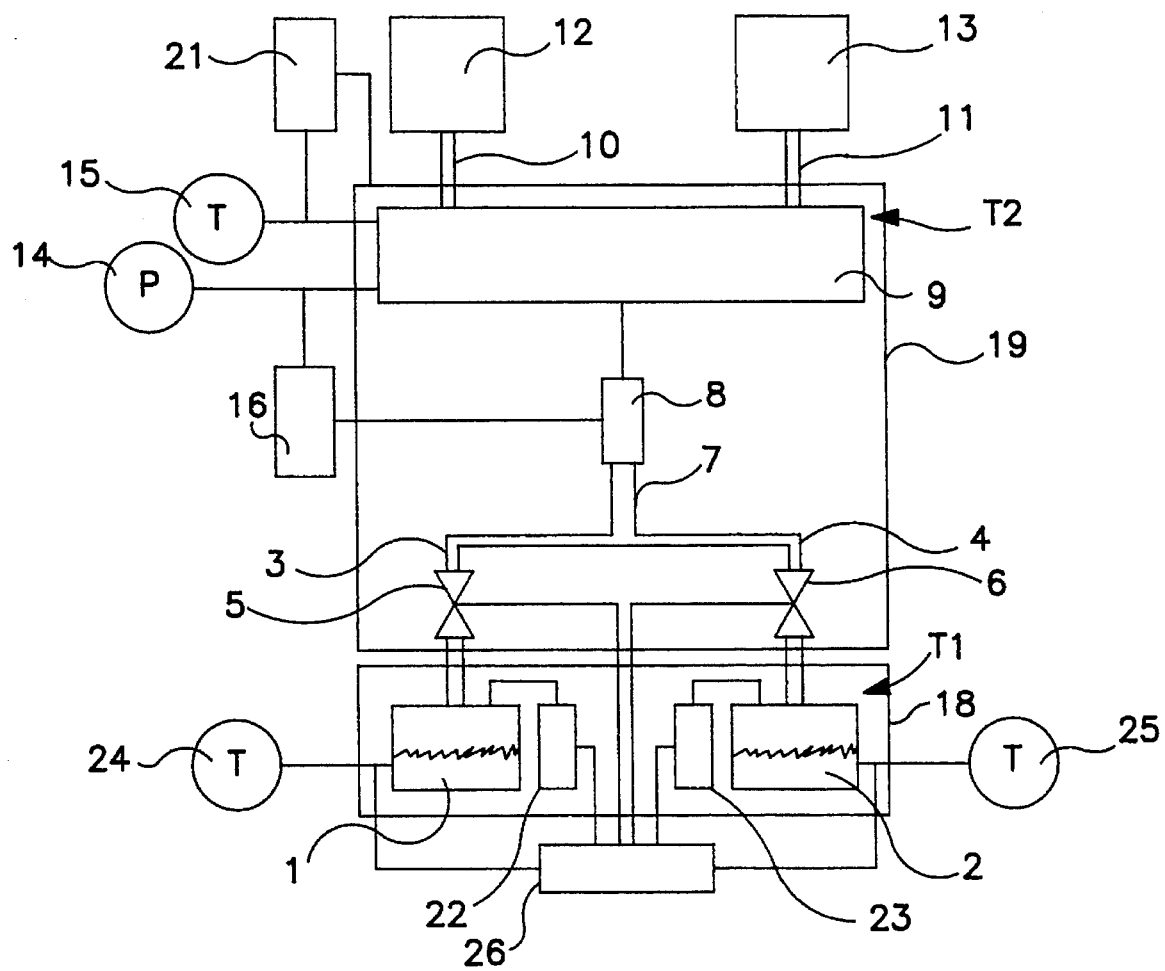
FIG. 1 is a schematic view of a supply apparatus according to a first embodiment.

FIG. 1 illustrates in a schematic view an apparatus with an intermediate reservoir 9 to which two storage tanks 1 and 2 are connected. These storage tanks 1 and 2 exhibit limit value pickups 22, 23 connected to a joint regulating device 26. Furthermore, the storage tanks 1 and 2 are equipped with temperature sensors 24 and 25 likewise connected to the regulating device 26.

In order to maintain a continuous gas flow from the storage tank 1 or 2, it is necessary for the tanks to be maintained at a given temperature $T_1$. This is done by conventional technique by heating device 18.

The two storage tanks 1 and 2 are connected via pipelines 3 and 4 to a main conduit 7 terminating into the intermediate reservoir 9. Valves 5 and 6 are provided in the pipelines 3 and 4 so that, during exchange of an empty storage tank 1, 2, the communication to the intermediate reservoir 9 can be interrupted. A mass flow regulator 8 is arranged in the main conduit 7; this regulator can also be replaced by a regulating valve. This mass flow regulator ensures that the amount of gas being replenished from the storage tank 1 or 2 is maintained at a desired value.

The intermediate reservoir 9 is equipped with a manometer 14 and a temperature sensor 15. The latter is connected to a regulating device 21 which is connected to a temperature control device 19 for the intermediate reservoir 9 so that this reservoir can be controlled to a desired temperature $T_2 > T_1$.

From the intermediate reservoir 9, pipelines 10, 11 lead to coating devices 12 and 13. In the present illustration, merely two coating devices are shown, but it is possible also to connect more than two coating devices to one intermediate reservoir 9. Each coating device 12, 13 can exhibit several coating stations; the subdivision of the gas mass flows takes place by means of a symmetrical pipe system optionally provided with means for setting the flow resistance, so that the flow resistance between the intermediate reservoir and each coating station and thus the distribution of the gas are maximally uniform. In case the system is to supply simultaneously coating stations which (as an exception) are of differing sizes, then it is merely necessary to adapt the flow resistances of the pipelines leading to these stations. The symmetrical pipe systems as well as valves arranged between the intermediate reservoir 9 and the coating stations are not illustrated in FIG. 1. Additional intermediate reservoirs (not shown) with the associated devices for other layer-forming gases are connected to the coating devices 12, 13.

As shown in FIG. 1, the manometer 14 is connected to a regulating device 16 which latter is connected with the mass flow regulator 8. When the gas, for coating purposes, flows from the intermediate reservoir 9 into the coating devices 12 and 13, the pressure in the intermediate reservoir 9 will drop below a predetermined desired value measured by the manometer 14. By means of a corresponding signal of the regulating device 16, the mass flow regulator 8 or the valve 8 in the main conduit 7 is then opened so that gas can be replenished from the respectively active storage tank 1 or 2 until the predetermined desired value has been regained.

Figure 2:
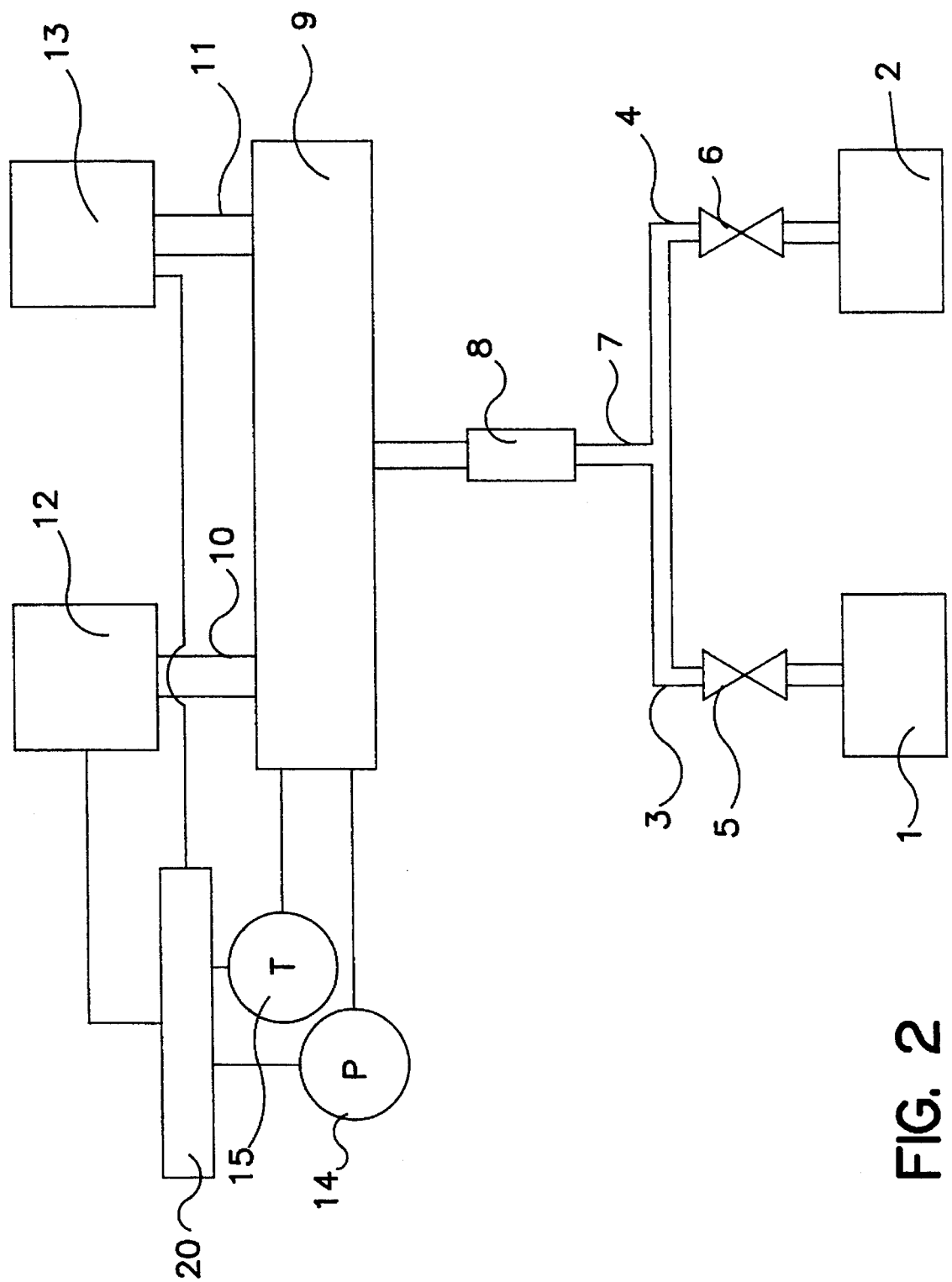
FIG. 2 is a schematic view of a supply apparatus according to another embodiment.

FIG. 2 shows another embodiment. The manometer 14 and the temperature sensor 15 are connected to a control device 20 which latter is electrically connected to the coating devices 12 and 13. This control device can also be utilized in conjunction with the embodiments shown in FIG. 1, FIG. 3, 4 or 5. Therefore, the components of the apparatus illustrated in FIG. 1, 3, 4 or 5 have been omitted from FIG. 2. In case temperature and pressure fluctuations should occur in the intermediate reservoir 9, which could negatively affect the coating step in the coating devices 12 and 13, the coating period and the mass flow in the coating devices 12 and 13 are correspondingly controlled by the control device 20 so that even minimal fluctuations can be compensated for. This arrangement, on the one hand, permits a fine adjustment of the layer thickness; on the other hand, another safety reserve is provided against failure.

Figure 3:
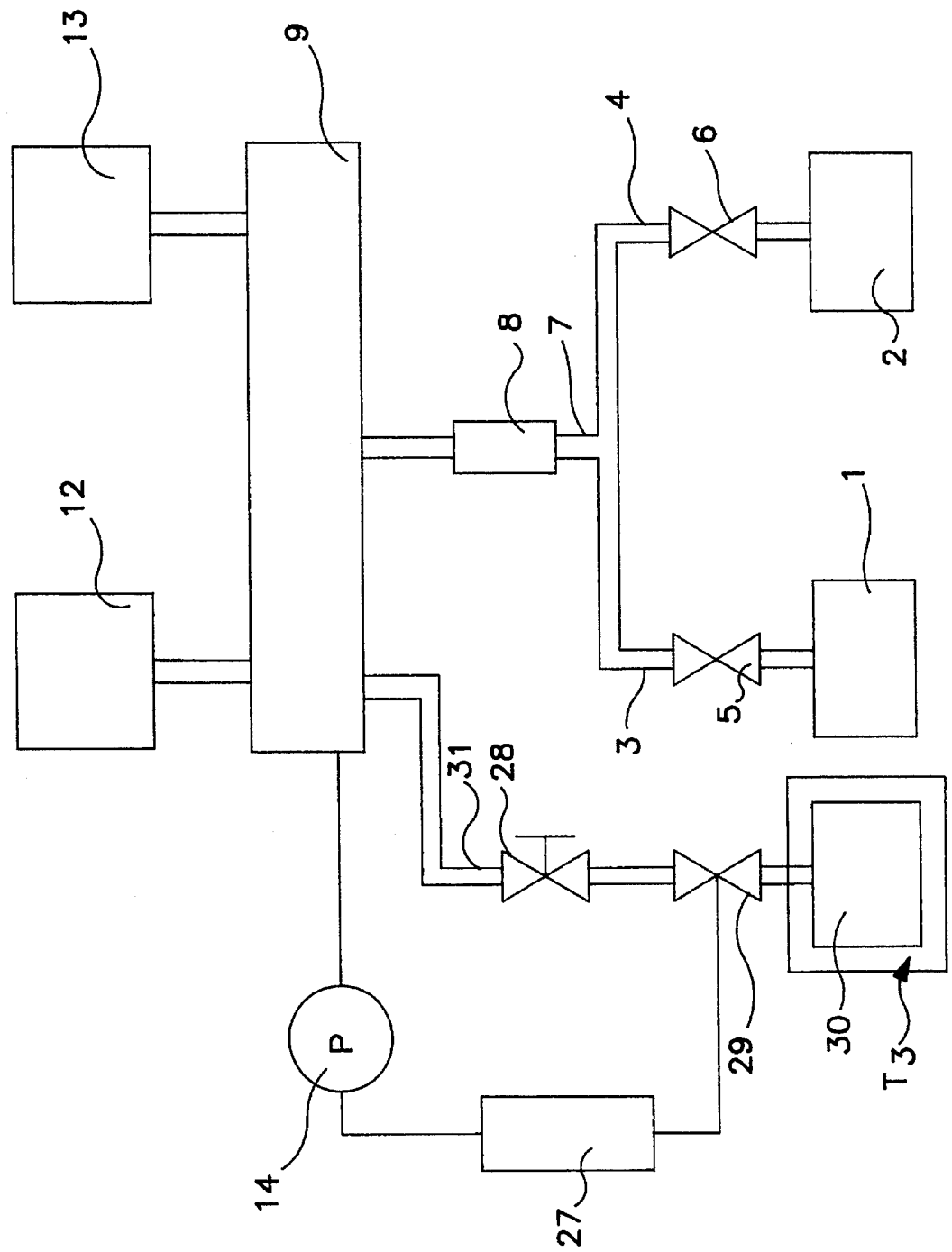
FIG. 3 is a schematic view of an embodiment with gas recovery.

FIG. 3 shows an arrangement with a gas recovery station 30. For reasons of clarity, several components illustrated in FIG. 1 have been omitted herein. The intermediate reservoir 9 is connected with the gas recovery station 30 by way of a pipeline 31 wherein a throttle 28 and a valve 29 are located; this gas recovery station is at a temperature $T_3$ lower as compared with the temperature $T_2$ of the intermediate reservoir. The manometer 14 is connected with the valve 29 via a regulating device 27. Once the pressure in a coating pause rises in the intermediate reservoir 9 above a predetermined desired value, this is measured by the manometer 14 whereupon the valve 29 is opened so that excess layer-forming gas can flow off into the gas recovery station 30 and can be condensed therein. The throttle 28 serves for ensuring a surge-free discharge from the intermediate reservoir 9.

Figure 4:
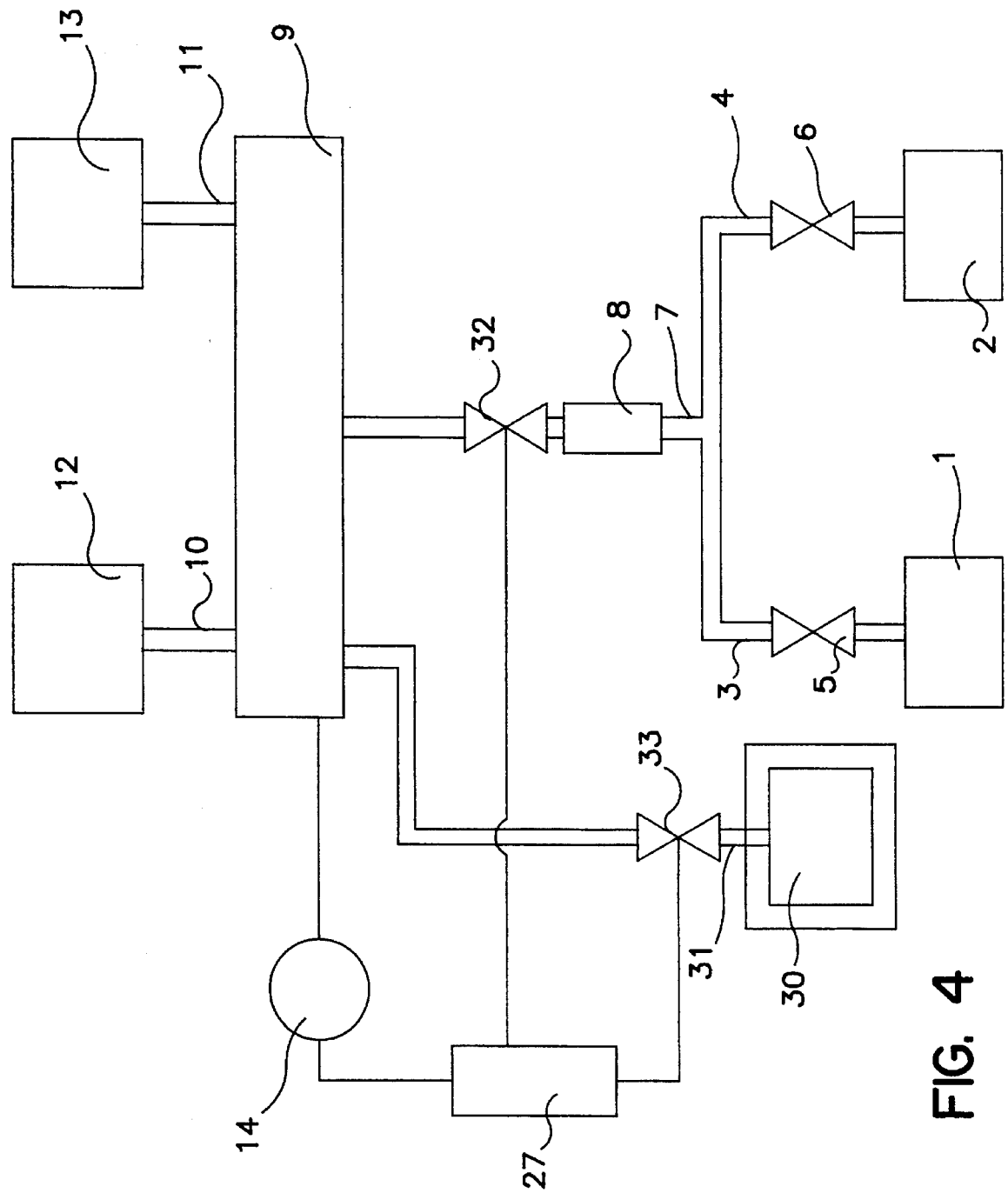
FIG. 4 is a schematic view of an apparatus with gas recovery according to another embodiment.
Figure 5:
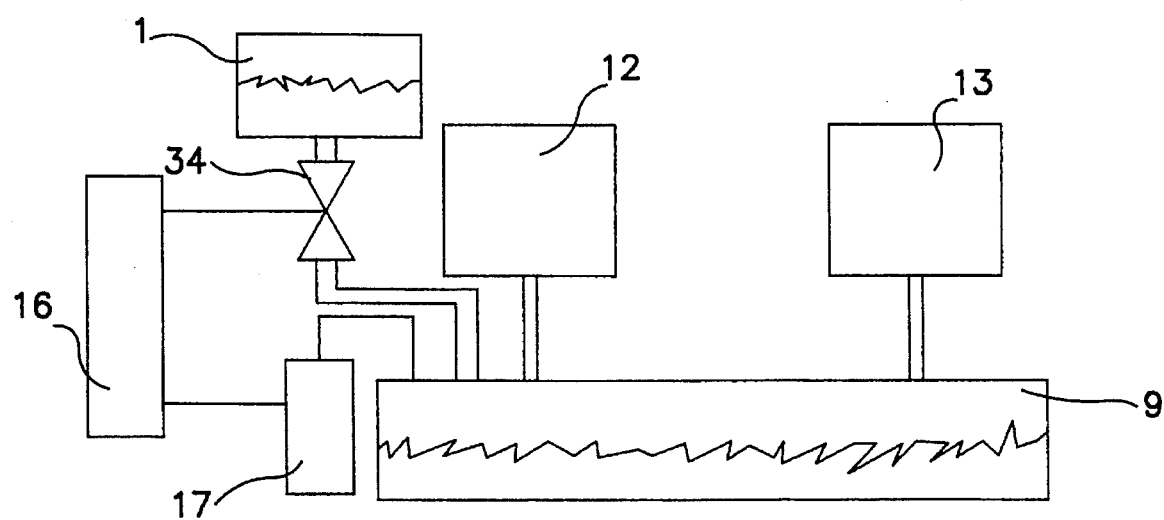
FIG. 5 is a schematic view of the apparatus wherein gas and liquid are in thermal equilibrium.

FIG. 4 shows schematically an arrangement altered as compared with FIG. 3 as regards the gas recovery station 30. The pipeline 31 leading to the gas recovery station 30 terminates into the main conduit 7, namely between the mass flow regulator 8 and a valve 32. A valve 33 is arranged in the pipeline 31 and is connected to the manometer 14 by way of the regulating device 27. When the pressure in the intermediate reservoir 9 rises in a coating pause above the predetermined desired value, the valve 32 is closed and the valve 33 is opened by way of the regulating device 27 so that the gas continuously being replenished from the storage tank 1 or 2 is rerouted into the gas recovery station 30.

If the intermediate reservoir 9 contains the layer-forming material in the liquid as well as gaseous phase (FIG. 5), the intermediate reservoir 9 is equipped with a filling level meter 17 connected, as an alternative to the manometer, with the control device 16. In case the liquid level in the intermediate reservoir 9 drops below a certain value, this is detected by the level meter 17 whereupon a valve 34 is opened so that liquid layer-forming material can be fed from the storage tank 1 into the intermediate reservoir 9.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever.

The entire disclosures of all applications, patents and publications, cited above and below, and of corresponding application German P 42 36 324.1-45, filed Oct. 28, 1992, are hereby incorporated by reference.

From the foregoing description, one skilled in the art can easily ascertain the essential characteristics of this invention, and without departing from the spirit and scope thereof, can make various changes and modifications of the invention to adapt it to various usages and conditions.

What is claimed is:

1. An apparatus for supplying a coating gas into at least one CVD coating device, wherein the apparatus includes at least one heated storage tank for a gaseous coating material and a pipeline system between the storage tank and the at least one CVD coating device, wherein mass flow regulators or valves are arranged in the pipeline system and wherein an unheated intermediate reservoir (9), heated only by gaseous material therein from the at least one heated storage tank for accommodating a gaseous coating material, is located between the at least one heated storage tank for accommodating the gaseous coating material and the at least one CVD coating device, means for adapting the volume of the intermediate reservoir (9) to a determined, maximum pressure change in the intermediate reservoir (9) upon withdrawal of a mass of gas required for a coating step.

2. An apparatus according to claim 1, characterized in that the means for adapting the intermediate reservoir (9) comprises a volume $V_z$ for the intermediate reservoir (9) with the volume $V_z$ being in the range of $0.1\ V < V_z < 10\ V$ wherein:

$$V = M/(p_z \times (\Delta p/p)_z^o)$$

M=total mass flow of the coating gas in mbar×l/sec,
$(\Delta p/p)_z^o$ determined relative pressure change per sec in the intermediate reservoir,
$p_z$=pressure in the intermediate reservoir in mbar with
$p_z$ process pressure in the coating device.

3. An apparatus according to claim 2, wherein the intermediate reservoir (9) includes a manometer (14) and a temperature sensor (15), wherein the temperature sensor (15) is connected to a regulating device (21).

4. An apparatus according to claim 3, wherein the manometer (14) is electrically connected by a regulating device (16) to a regulating valve or mass flow regulator (8) arranged in a pipeline (7) between at least one heated storage tank and the intermediate reservoir (9).

5. An apparatus according to claim 3, wherein the intermediate reservoir (9) has a filling level meter (17) electrically connected, by way of the regulating device (16), with a valve or mass flow regulator (8) arranged in a pipeline (7) between at least one heated storage tank and the intermediate reservoir (9).

6. An apparatus according to claim 4, wherein the manometer (14) and the temperature sensor (15) are electrically connected to a control device (20) which is cdnnected to the at least one CVD coating device to control a coating time or a mass flow of the coating gas.

7. An apparatus according to claim 6, wherein at least two storage tanks (1, 2) containing the same coating material are connected to the intermediate reservoir (9).

8. An apparatus according to claim 7, wherein each storage tank (1, 2) is connected via a valve (5, 6) to a main conduit (7) leading to the intermediate reservoir (9), the mass flow regulator (8) being arranged in the same main conduit leading to the intermediate reservoir.

9. An apparatus according to claim 8, wherein each storage tank (1, 2) includes filling level sensors (22, 23) for liquid level and temperature sensors (24, 25) which are connected to a regulating device (26), the latter controlling a temperature regulating device (18).

10. An apparatus according to claim 9, wherein the intermediate reservoir (9) is connected to a gas recovery station (30).

11. An apparatus according to claim 10, wherein that a valve (29) is arranged in a pipeline (31) between the gas recovery station (30) and the intermediate reservoir (9), this valve being electrically connected by way of a regulating device (27) with the manometer (14) of the intermediate reservoir (9).

12. An apparatus according to claim 9, wherein a pipeline (3, 4, 7) arranged between each storage tank (1, 2) and the intermediate reservoir (9) is connected by way of a valve (33) to a gas recovery station (30).

13. An apparatus according to claim 1, wherein the intermediate reservoir (9) includes a manometer (14) and a temperature sensor (15), wherein the temperature sensor (15) is connected to a regulating device (21).

14. An apparatus according to claim 1, wherein the intermediate reservoir (9) has a filling level meter (17) electrically connected, by way of a regulating device (16), with a valve or mass flow regulator (8) arranged in a pipeline (7) between the at least one heated storage tank and the intermediate reservoir (9).

15. An apparatus according to claim 3, wherein the manometer (14) and the temperature sensor (15) are electrically connected to a control device (20) which is connected to the at least one CVD coating device to control a coating time or a mass flow of the coating gas.

16. An apparatus according to claim 1, wherein at least two storage tanks (1, 2) for a coating material are connected to the intermediate reservoir (9).

17. An apparatus according to claim 4, wherein each storage tank (1, 2) is connected via a valve (5, 6) to a main conduit (7) leading to the intermediate reservoir (9) or the mass flow regulator (8) being arranged in this main conduit.

18. An apparatus according to claim 1, wherein there are two storage tanks (1, 2), and each storage tank (1, 2) contains the same coating material and includes filling level sensors (22, 23) for liquid level and temperature sensors (24, 25) which are connected to a regulating device (26), the regulating device (26) for the tanks (1, 2) controlling a temperature regulating device (18).

19. An apparatus according to claim 1, wherein the intermediate reservoir (9) is connected to a gas recovery station (30).

\* \* \* \* \*